(12) United States Patent
Seo et al.

(10) Patent No.: US 9,292,430 B2
(45) Date of Patent: Mar. 22, 2016

(54) METHOD OF WRITING DATA, MEMORY, AND SYSTEM FOR WRITING DATA IN MEMORY

(75) Inventors: Myoung Kyu Seo, Gyeonggi-do (KR); Tae Sun Hwang, Gyeonggi-do (KR)

(73) Assignee: INDUSTRIAL BANK OF KOREA, Seoul (KR)

( * ) Notice: Subject to any disclaimer, the term of this patent is extended or adjusted under 35 U.S.C. 154(b) by 133 days.

(21) Appl. No.: 14/009,221

(22) PCT Filed: Mar. 22, 2012

(86) PCT No.: PCT/KR2012/002048
§ 371 (c)(1),
(2), (4) Date: Oct. 1, 2013

(87) PCT Pub. No.: WO2012/134097
PCT Pub. Date: Oct. 4, 2012

(65) Prior Publication Data
US 2014/0040538 A1    Feb. 6, 2014

(30) Foreign Application Priority Data

Apr. 1, 2011    (KR) .......................... 10-2011-0030400

(51) Int. Cl.
G06F 12/02    (2006.01)
G11C 16/04    (2006.01)
G11C 16/10    (2006.01)
G11C 16/06    (2006.01)
G11C 16/24    (2006.01)

(52) U.S. Cl.
CPC ........ *G06F 12/0246* (2013.01); *G11C 16/0483* (2013.01); *G11C 16/06* (2013.01); *G11C 16/10* (2013.01); *G11C 16/105* (2013.01); *G11C 16/24* (2013.01)

(58) Field of Classification Search
None
See application file for complete search history.

(56) References Cited

U.S. PATENT DOCUMENTS

| | | | |
|---|---|---|---|
| 6,571,312 B1 | 5/2003 | Sugai et al. | |
| 6,836,432 B1 | 12/2004 | Parker et al. | |
| 7,477,547 B2 * | 1/2009 | Lin | 365/185.09 |
| 7,796,440 B2 | 9/2010 | Lee | |
| 2003/0043627 A1 | 3/2003 | Moschopoulos et al. | |
| 2003/0046484 A1 * | 3/2003 | Lasser | 711/103 |
| 2004/0255092 A1 * | 12/2004 | Nishikawa et al. | 711/203 |
| 2008/0151622 A1 | 6/2008 | Qawami et al. | |
| 2010/0329014 A1 | 12/2010 | Lim et al. | |
| 2010/0332946 A1 * | 12/2010 | Lee et al. | 714/763 |

FOREIGN PATENT DOCUMENTS

| KR | 100669342 B1 | 1/2007 |
|---|---|---|
| KR | 20070002344 A | 1/2007 |

(Continued)

OTHER PUBLICATIONS

International Search Report mailed Oct. 18, 2012; PCT/KR2012/002048.

(Continued)

*Primary Examiner* — Jared Rutz
*Assistant Examiner* — Christopher Do
(74) *Attorney, Agent, or Firm* — Ladas & Parry LLP

(57) ABSTRACT

A method of writing data in a memory comprising a NAND cell array is disclosed, wherein a data output device completes the writing process only by transmitting the data and a start address for writing the data to the memory.

7 Claims, 18 Drawing Sheets

(56) References Cited

FOREIGN PATENT DOCUMENTS

| KR | 100737919 | B1 | 7/2007 |
| KR | 100832461 | B1 | 5/2008 |
| KR | 20090101195 | A | 9/2009 |

OTHER PUBLICATIONS

Extended European Search Report Appl. No. 12764014.2-1805; Dated Jan. 30, 2015.

* cited by examiner

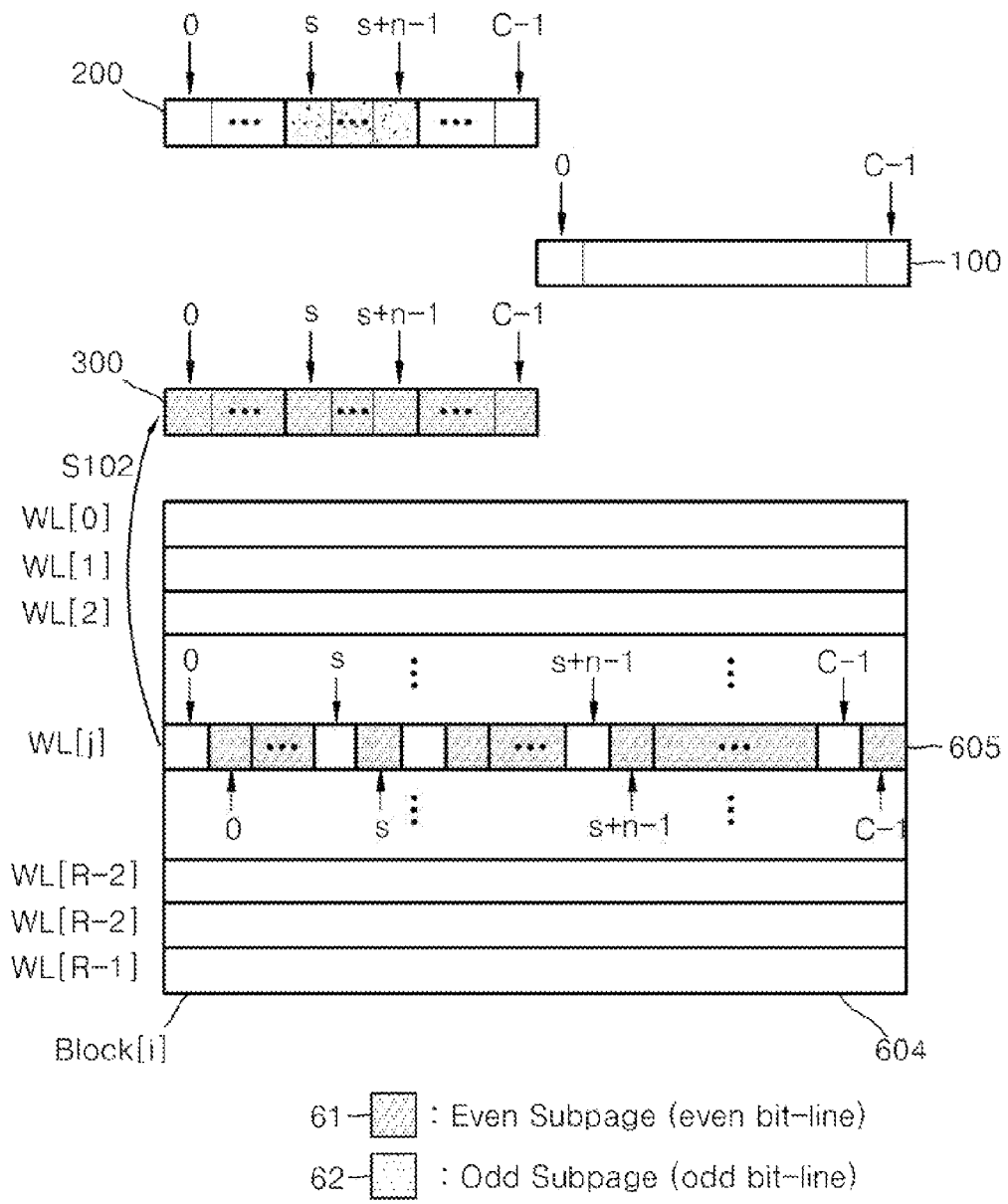

61 — [dotted square] : Even Subpage (even bit-line)
61 — [shaded square] : Even Subpage (even bit-line)

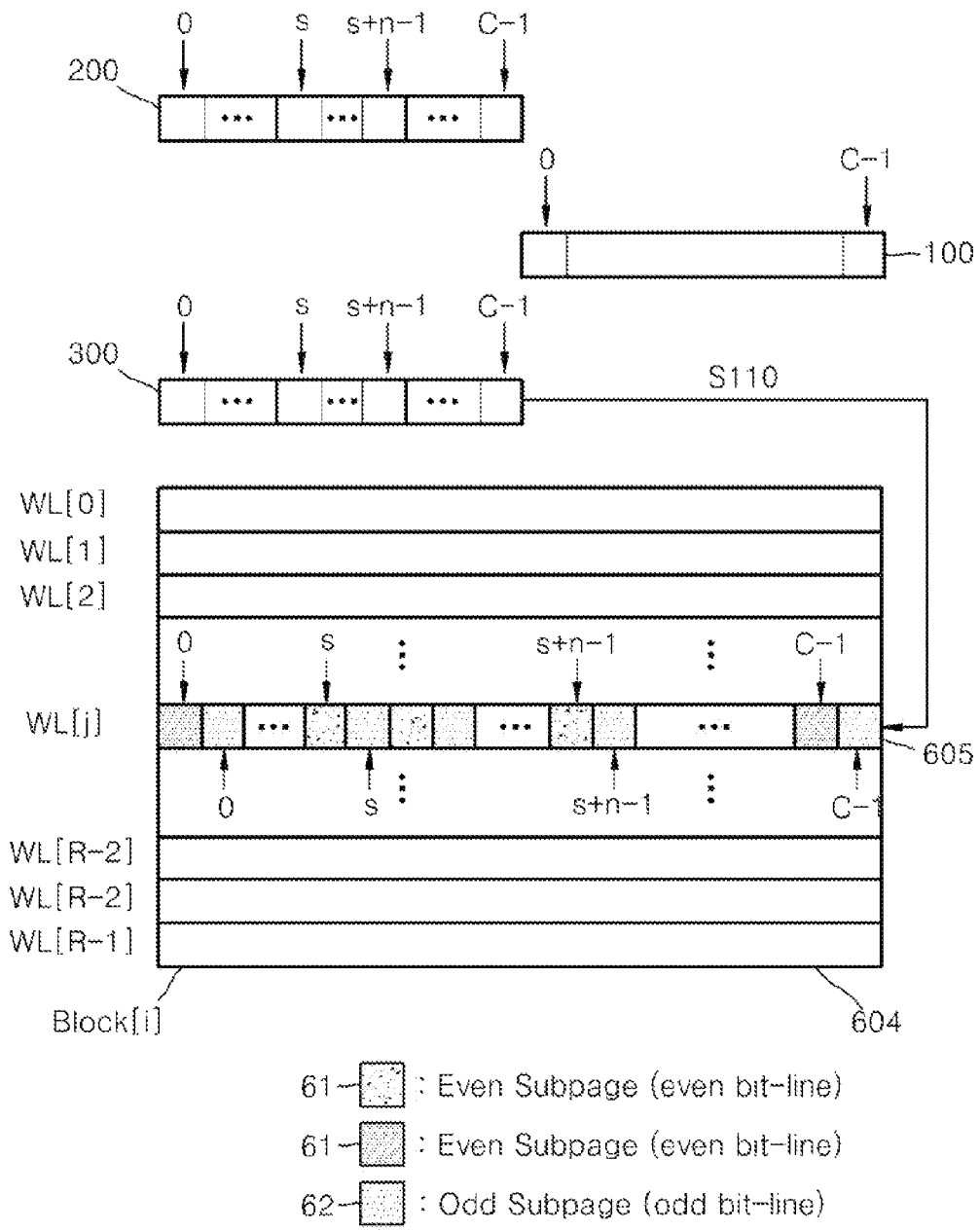

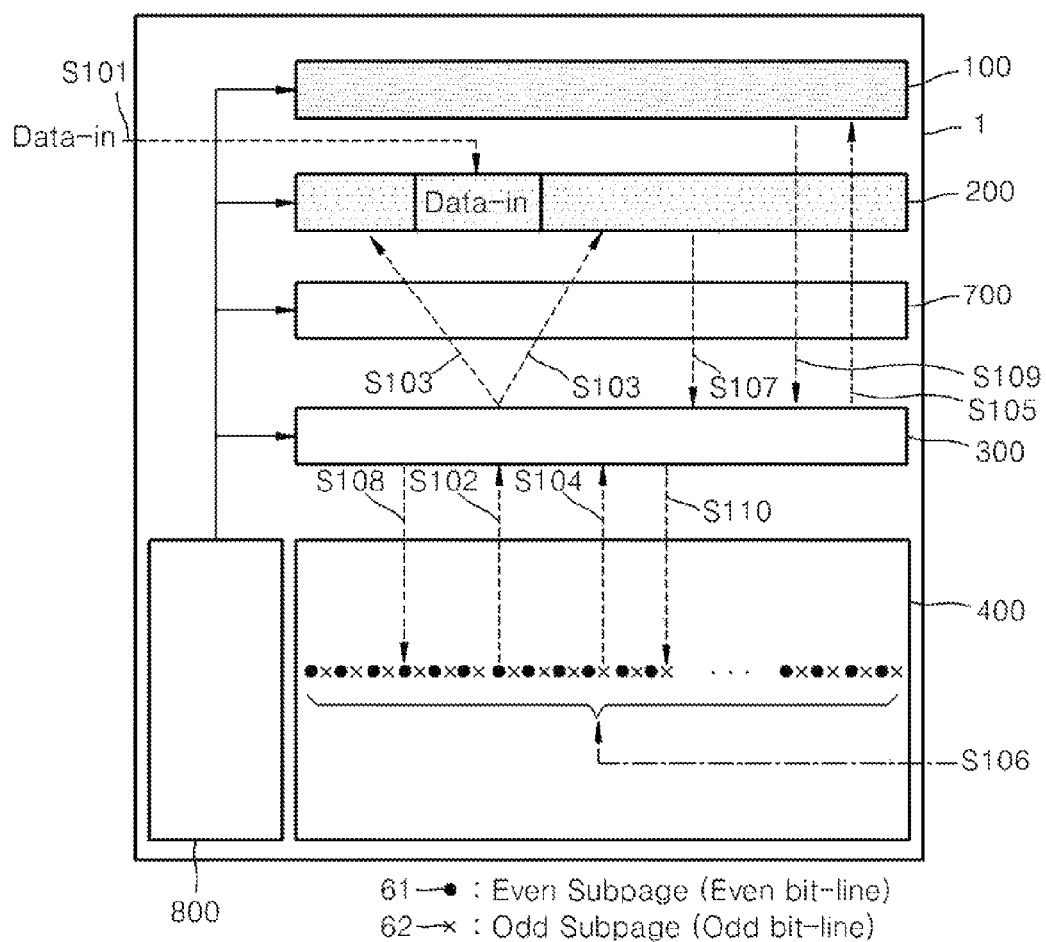

METHOD OF WRITING DATA, MEMORY, AND SYSTEM FOR WRITING DATA IN MEMORY

TECHNICAL FIELD

The present invention relates to a memory, a system for writing data in the memory, and a method of writing data in the memory, and more particularly, to a technology applied to a memory including a NAND cell array.

BACKGROUND ART

A non-volatile memory device such as a flash memory not only has excellent data retention characteristics, and but also has low power consumption and high impact-resistant characteristics in comparison to a hard disk. In particular, a flash memory having a NOR structure allows high-speed random access and thus is used to store codes, and a flash memory having a NAND structure has a high level of integration and allows a page operation, and thus is generally used to store data. The above-described flash memory is required to sequentially exchange data with a host according to a product or an interface.

A NAND cell array may include a plurality of blocks, and each block may have a matrix structure of rows referred to as word-lines, and columns referred to as bit-lines.

In general, three types of operations, for example, erase, program, and read, may be performed on a NAND cell. An erase operation may be performed in units of a block or a word-line. When a program operation is performed, all NAND cells in one word-line should be programmed at the same time.

DETAILED DESCRIPTION OF THE INVENTION

Technical Problem

Even when only some cells included in one word-line of a NAND cell array are programmed, data of other cells included in the word-line should also be changed. Accordingly, in order to program only some cells, data of a corresponding word-line needs to be backed up by reading and saving the data. After that, new data should be prepared by changing data of cells to be programmed in the backup data, the word-line to be programmed should be entirely erased and, lastly, the whole word-line is programmed by using the newly prepared data. In order to perform a series of the above operations, a host device for controlling a memory including a NAND cell array should transmit at least an instruction for erasing the word-line and an instruction for programming the word-line.

The present invention provides a method of writing data in a memory so as to allow a host device to write the data in the memory by using only one write instruction, a memory using the method, and a system for writing data in the memory by using the method.

Technical Solution

Solutions of the above-described technical problems will now be described.

According to an aspect of the present invention, there is provided a memory including a NAND cell array; and at least two registers, so as to allow a host device for controlling the memory to write data in the memory by using only one write instruction.

According to an aspect of the present invention, there is provided a method of writing data, the method including saving input data provided from outside a memory including a NAND cell array, in at least a part of a first register included in the memory, and saving a part of data stored in a first page of the NAND cell array, in a remaining part of the first register; saving data stored in a second page of the NAND cell array, in a second register included in the memory; erasing the data stored in the first and second pages; and programming the data stored into the first register, in the first page, and programming the data stored in the second register, into the second page.

According to another aspect of the present invention, there is provided a memory including a NAND cell array; a control unit; and a first register and a second register configured to receive data stored in the NAND cell array, wherein the control unit is configured to store input data provided from outside the memory, in at least a part of the first register, store a part of data stored in a first page of the NAND cell array, in a remaining part of the first register, and store data stored in a second page of the NAND cell array, in the second register; then erase the data stored in the first and second pages; and then program the data stored in the first register, in the first page, and program the data stored in the second register, in the second page.

According to another aspect of the present invention, there is provided a method of writing data in a memory, comprising: a data output device transmitting the data and a start address for writing the data to complete writing the data in the memory only by the transmitting step.

According to another aspect of the present invention, there is provided a system for writing data in a memory including a NAND cell array, the system including the memory; and a data output device configured to write the data in the memory, wherein the memory is configured to complete a process of writing the data in the memory, only by receiving the data and a start address for writing the data.

Advantageous Effects

According to the present invention, a host device may store data in a memory including a NAND cell array by transmitting only one write instruction.

DESCRIPTION OF THE DRAWINGS

FIGS. 5A through 5K are schematic diagrams for describing a method of writing data in a memory according to an embodiment of the present invention.

FIG. 6 is a schematic diagram showing the internal structure of a memory according to another embodiment of the present invention.

BEST MODE

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. The terminology used herein is for the purpose of describing particular embodiments and is not intended to limit the invention. As used herein, the singular forms "a", "an", and "the" are intended to include the plural forms as well, unless the context clearly indicates otherwise.

A non-volatile memory device according to embodiments of the present invention may refer to a memory device capable of retaining data even when power is cut off. For example, the non-volatile memory device may include a flash memory, an electrically erasable programmable read-only memory (EEPROM), a phase-change random access memory (PRAM), a magnetic random access memory (MRAM), or a resistive random access memory (RRAM). The flash memory may also be referred to as a floating gate memory, a charge trapping memory, or a silicon-oxide-nitride-oxide-silicon (SONOS) memory, and the above names do not limit the scope of the embodiments.

Figure 1A:
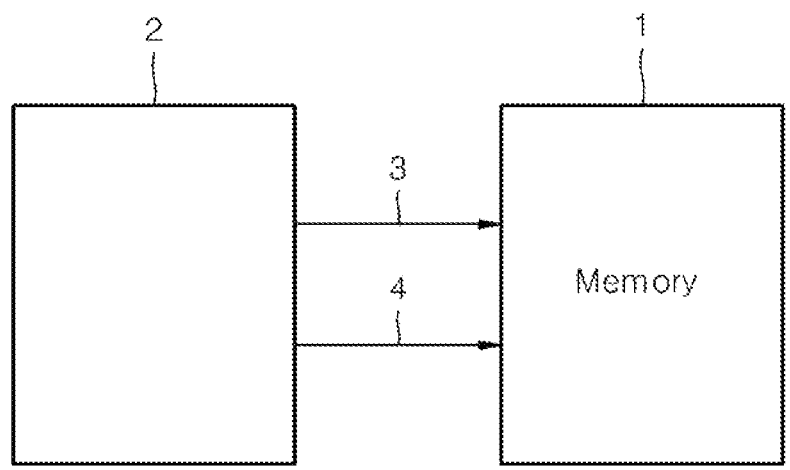
FIG. 1A is a block diagram of a system for writing data in a memory, according to an embodiment of the present invention.

FIG. 1A is a block diagram of a system for writing data in a memory 1, according to an embodiment of the present invention.

A host device 2 may be connected to the memory 1 including a NAND cell array via an address input line 3 and a data input line 4. If the host device 2 transmits data to be written and a write location of the data via the data input line 4 and the address input line 3 to the memory 1, the data may be written in the memory 1. In this case, each of the address input line 3 and the data input line 4 may be formed as one line or a plurality of lines.

Figure 1B:
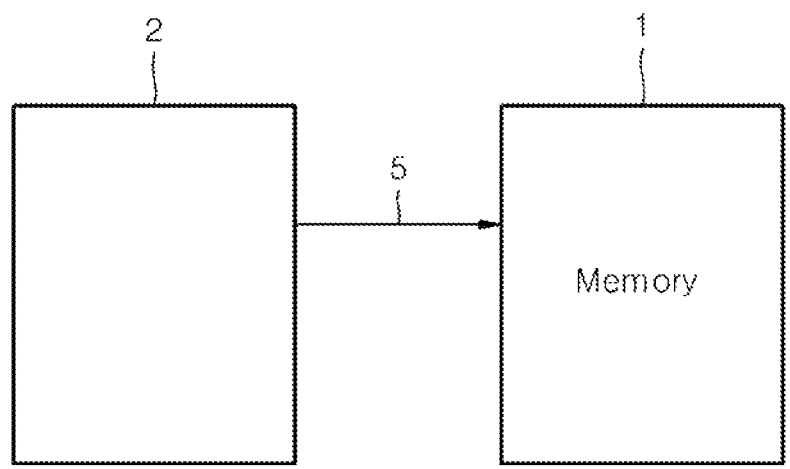
FIG. 1B is a block diagram of a system for writing data in a memory, according to another embodiment of the present invention.

FIG. 1B is a block diagram of a system for writing data in the memory 1, according to another embodiment of the present invention.

The host device 2 may be connected to the memory 1 via an input line 5. If the host device 2 transmits data to be written and a write location of the data via the input line 5 to the memory 1, the data may be written in the memory 1. In this case, the input line 5 may be formed as one line or a plurality of lines.

Figure 2A:
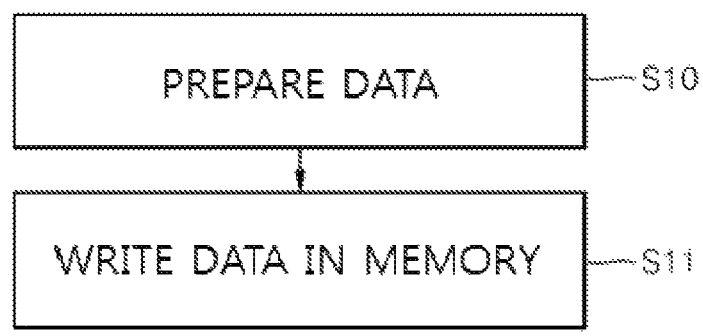
FIG. 2A is a flowchart of a process that a host device writes data in a memory including a NAND cell array in a system for writing data in the memory, according to an embodiment of the present invention.

FIG. 2A is a flowchart of a process that a host device writes data in a memory including a NAND cell array in a system for writing data in the memory, according to an embodiment of the present invention.

In operation S10, the host device prepares data to be written in the memory. In this case, a start address for starting to store the data (i.e., a start point of a write location of the data) may also be prepared. In operation S11, the host device may transmit the prepared data and the start address to the memory together with a write instruction, and thus may write the data in the memory. According to an embodiment, the host device may also transmit a length of the data to be written.

Figure 2B:
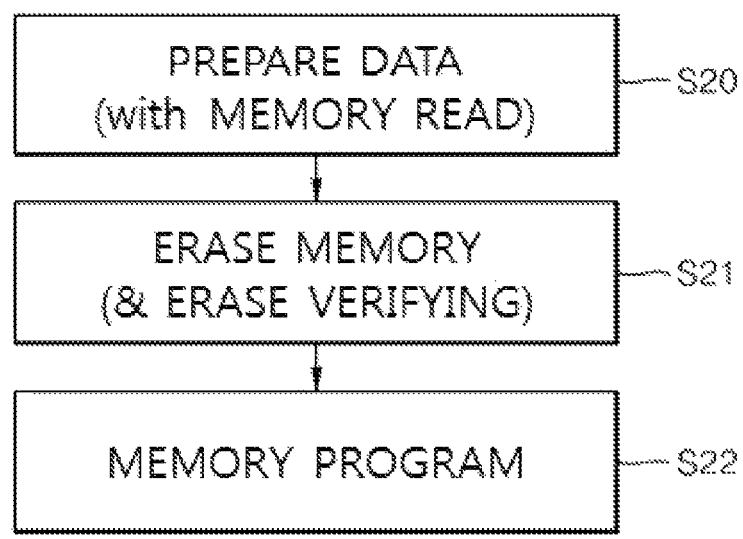
FIG. 2B is a flowchart of a process that a host device programs data in a memory including a NAND cell array in a system for writing data in the memory, according to another embodiment of the present invention.

FIG. 2B is a flowchart of a process that a host device programs data in a memory including a NAND cell array in a system for writing data in the memory, according to another embodiment of the present invention.

In operation S20, the host device prepares data to be programmed in the memory. After that, in operation S21, a corresponding word-line or a corresponding block of the memory is erased. Due to the above erase operation, since data of an undesired cell may be erased, in operation S20, the host device may previously read and back up data of a word-line or a block to be erased and then may replace a corresponding part of the backup data with the data to be programmed, so as to prepare the data. After that, in operation S22, the host device may transmit the data prepared in operation S20, and a start address to the memory together with a program instruction, and thus may program the data in the memory. According to an embodiment, the host device may also transmit a length of the data to be written.

If the method of writing data in FIG. 2A and the method of programming data in FIG. 2B are used, the same data may be stored in the memory. However, according to the method of FIG. 2A, operation of the host device is simpler in comparison to the method of FIG. 2B.

Figure 3:
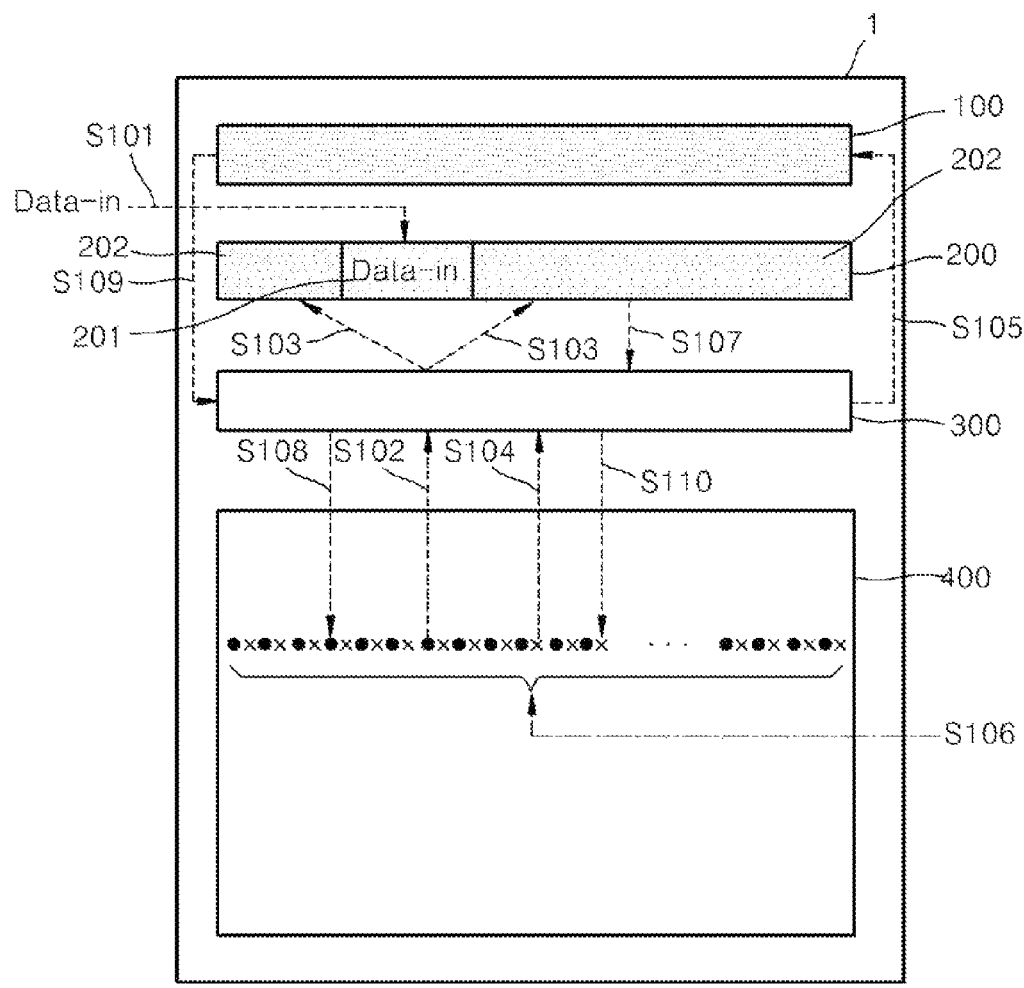
FIG. 3 is a schematic diagram showing the structure of a memory including a NAND cell array, according to an embodiment of the present invention.

FIG. 3 is a schematic diagram showing the structure of the memory 1 including a NAND cell array 400, according to an embodiment of the present invention. Components other than those illustrated in FIG. 3 may be included in the memory 1, but are not illustrated for convenience of explanation.

Referring to FIG. 3, the memory 1 may include an odd register 100, an even register 200, a page buffer 300, and the NAND cell array 400. Hereinafter, the odd register 100 may also be referred to as a second register 100, and the even register 200 may also be referred to as a first register 200.

The NAND cell array 400 may include a plurality of word-lines and a plurality of bit-lines. One word-line included in the NAND cell array 400 may correspond to one page. One page may be divided into an even subpage 61 and an odd subpage 62. The even subpage 61 may be defined as a set of even bit-lines 61, and the odd subpage 62 may be defined as a set of odd bit-lines 62. The even and odd bit-lines 61 and 62 may be aligned in an interleaved structure. Hereinafter, the even subpage 61 may also be referred to as a first page 61, and the odd subpage 62 may also be referred to as a second page 62.

The odd register 100 is configured to store data stored in the odd bit-lines 62 of a certain word-line. The even register 200 is configured to store data stored in the even bit-lines 61 of the certain word-line.

If a start address for inputting 'input data' (Data-in) input from outside the memory 1 corresponds to the even subpage 61, the input data may be stored in a part 201 of the even register 200. In this case, data of the even subpage 61 may be written in a remaining part 202 of the even register 200 other than the part 201. In this case, the data of the even subpage 61 may be data of a remaining part other than a part to be replaced with the input data. Similarly, if the start address for inputting the input data provided(input) from outside the memory 1 corresponds to the odd subpage 62, a similar operation may be performed in the above manner.

A process of writing the input data in the memory 1 will now be described with reference to FIG. 3. FIG. 3 shows an example that the start address for inputting the 'input data' (Data-in) input from outside the memory 1 corresponds to the even subpage 61. In operation S101, the input data provided from outside the memory 1 may be stored in the part 201 of the even register 200. In operation S102, data stored in the even subpage 61 may be read and stored in the page buffer 300. In operation S103, from among the data of the even subpage 61 stored in the page buffer 300, data of a remaining part other than a part to be replaced with the input data may be stored in the remaining part 202 of the even register 200. In operation S104, data stored in the odd subpage 62 may be read and stored in the page buffer 300. In operation S105, the data of the odd subpage 62 stored in the page buffer 300 may be stored in the odd register 100. In operation S106, all data written in a word-line corresponding to the even and odd subpages 61 and 62 may be erased. In operation S107, the data stored in the even register 200 may be stored in the page buffer 300. In operation S108, the data of the even register 200 stored in the page buffer 300 may be programmed in the even subpage 61. In operation S109, the data stored in the odd register 100 may be stored in the page buffer 300. In operation S110, the data of the odd register 100 stored in the page buffer 300 may be programmed in the odd subpage 62.

The order of operations S102, S103, S104, and S105 may be changed to an order of operations S104, S105, S102, and S103. Also, the order of operations S107, S108, S109, and S110 may be changed to an order of operations S109, S110, S107, and S108.

Figure 4:
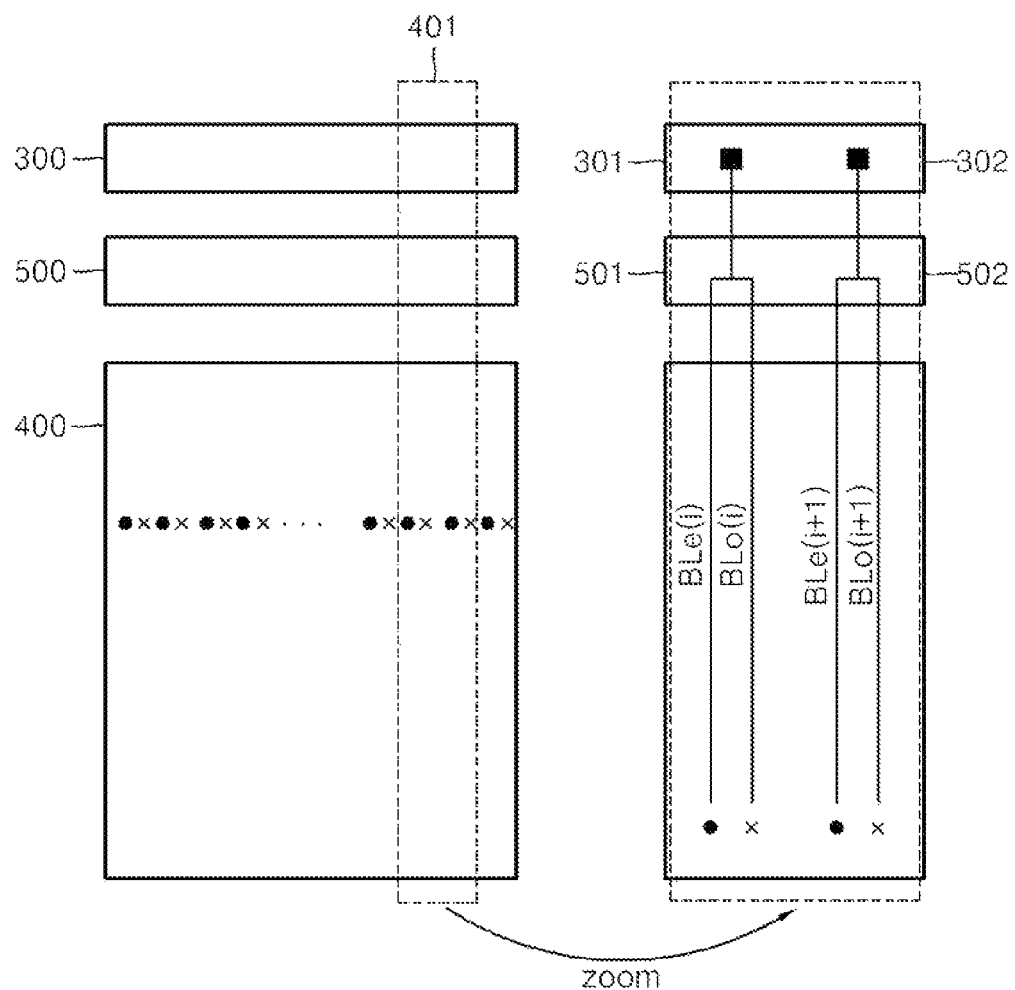
FIG. 4 is a schematic diagram showing the structures of and the connections between the page buffer and the NAND cell array illustrated in FIG. 3.

FIG. 4 is a schematic diagram showing the structures of and the connections between the page buffer 300 and the NAND cell array 400 illustrated in FIG. 3.

Referring to FIG. 4, a bit selector 500 not illustrated in FIG. 3 may be further disposed on a signal transmission path between the page buffer 300 and the NAND cell array 400. Referring to a zoomed view of a part 401 of the page buffer 300, the NAND cell array 400, and the bit selector 500, the bit selector 500 may select one of an even bit-line BLe(i) and an odd bit-line BLe(i) that are adjacent to each other, and may connect the selected bit-line to the page buffer 300. In this case, if a module 501 of the bit selector 500 selects the even bit-line BLe(i), another module of the bit selector 500 (e.g., a module 502) may also select an even bit-line BLe(i+1).

Although FIGS. 3 and 4 shows a single side interleaving architecture, according to an embodiment, a double side interleaving architecture may also be used.

A method of writing data, according to an embodiment of the present invention, will now be described in detail with reference to the attached drawings.

FIGS. 5A through 5K are schematic diagrams for describing a method of writing data in a memory according to an embodiment of the present invention.

Figure 5A:
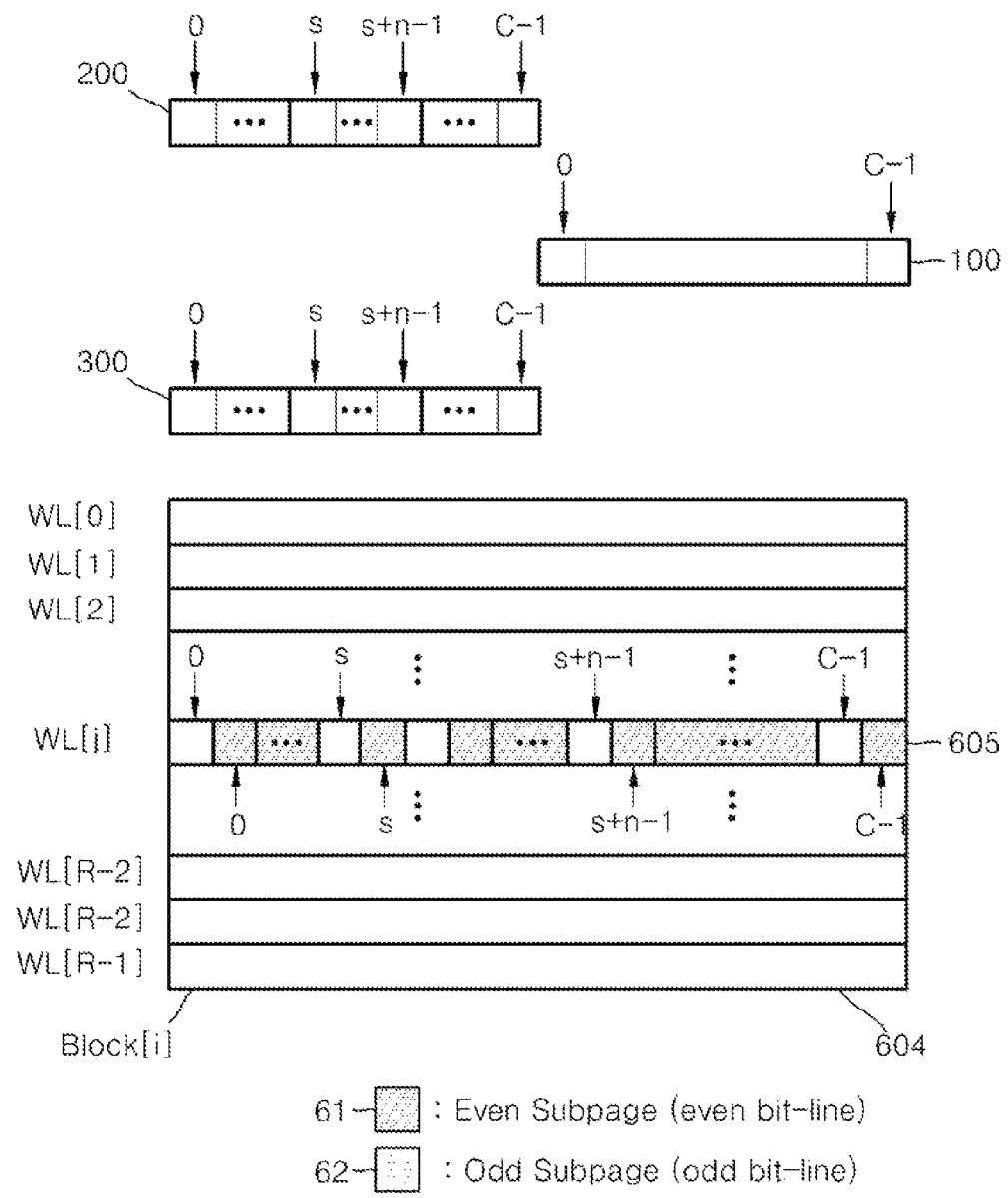

FIG. 5A shows a detailed structure of a block 604 having an index [i] from among a plurality of blocks included in a NAND cell, the even register 200, the odd register 100, and the page buffer 300.

Each of the odd register 100, the even register 200, and the page buffer 300 is configured to store C data. Here, C may be the number of bits that may be written in one subpage of the NAND cell, for example, C=2048. The block 604 may include R word-lines, for example, R=16.

FIGS. 5A through 5K show a process that input data provided from outside the memory is written in NAND cells having indices $\{[s], [s+1], \ldots, [s+n-1]\}$ from among the even subpages 61 included in a word-line 605 having an index [j]. Here, in FIGS. 5A through 5K, each of $0, \ldots, s, \ldots, s+n-1, \ldots, C-1$ denotes an index of a data bit. Also, it is assumed that a length of the data input from outside the memory is a natural number n, and that the input data is data to be written in NAND cells having indices $\{[s], \ldots, [s+n-1]\}$ from among the even subpages 61 included in the word-line 605. Hereinafter, the input data may be denoted as $\{DN[s], \ldots, DN[s+n-1]\}$. A start address s for writing the input data may be input to the memory together with the input data.

Referring to FIG. 5A, the even and odd subpages 61 and 62 of the word-line 605 may be in an erased state, or certain data may be stored therein due to a previous program operation. The data stored in each NAND cell may be '0' or '1', or may be one of three or more values each of which constituting multi-level information.

Figure 5B:
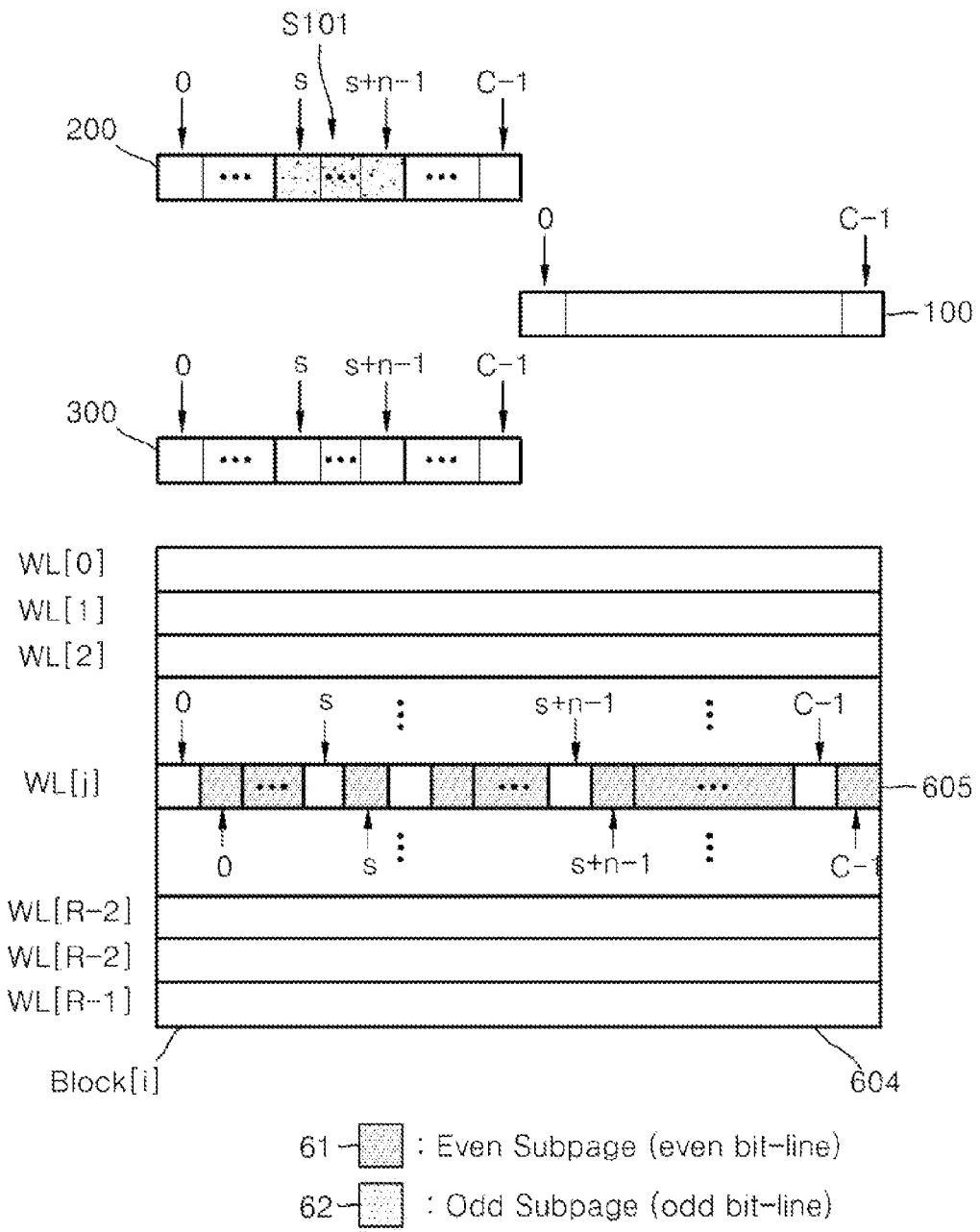

Referring to FIG. 5B, in operation S101, the input data $\{DN[s], \ldots, DN[s+n-1]\}$ may be stored in cells having the indices $\{[s], \ldots, [s+n-1]\}$ of the even register 200.

After that, referring to FIG. 5C, in operation S102, all data $\{DE[0], DE[1], DE[2], \ldots, DE[C-1]\}$ of NAND cells having indices $\{[0], [1], [2], \ldots, [C-1]\}$ from among the even subpages 61 included in the word-line 605 may be stored in the page buffer 300.

Figure 5D:
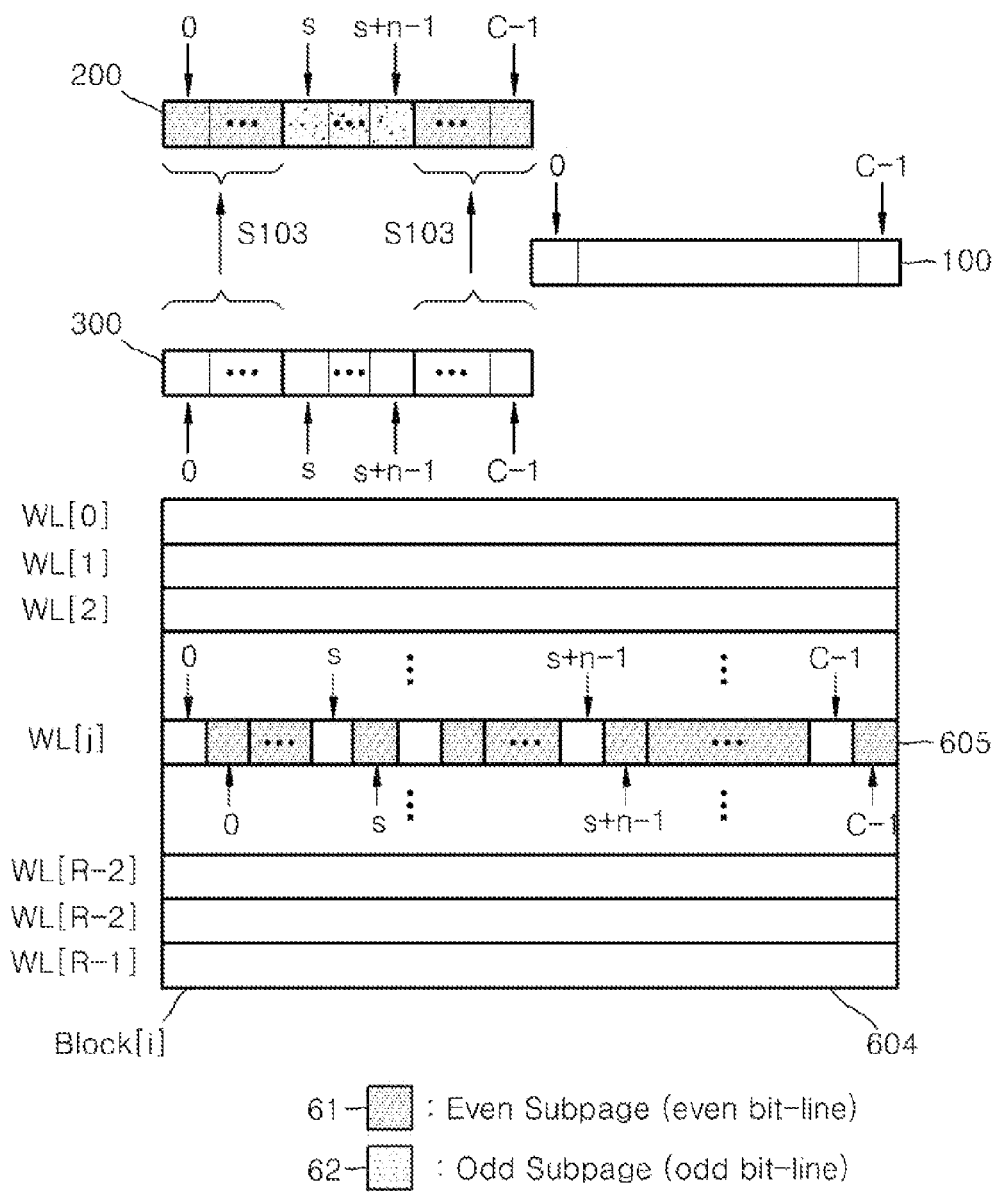

After that, referring to FIG. 5D, in operation S103, the data $\{DE[0], DE[1], \ldots, DE[s-1]\}$ and the data $\{DE[s+n], \ldots, DE[C-1]\}$ stored to correspond to the indices $\{[0], [1], \ldots, [s-1]\}$ and the indices $\{[s+n], [C-1]\}$ from among the data stored in the page buffer 300 may be respectively stored in cells having the indices $\{[0], [1], \ldots, [s-1]\}$ and cells having the indices $\{[s+n], \ldots, [C-1]\}$ of the even register 200. As a result, the data $\{DE[0], DE[1], \ldots, DE[s-1], DN[s], \ldots, DN[s+n-1], DE[s+n], \ldots, DE[C-1]\}$ are stored in the cells having the indices $\{[0], [1], \ldots, [s-1], [s], \ldots, [s+n-1], [s+n], \ldots, [C-1]\}$ of the even register 200.

Figure 5E:
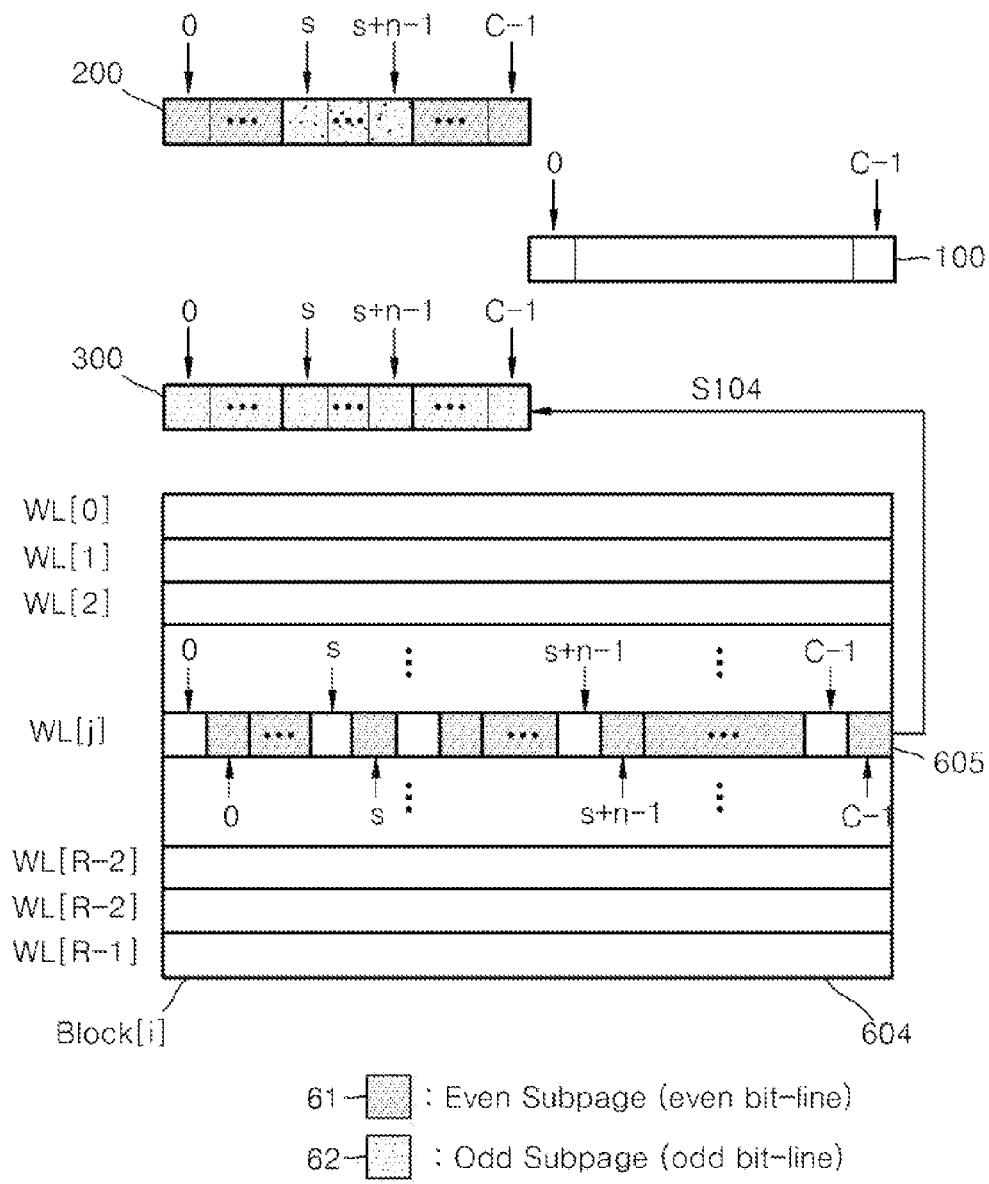

After that, referring to FIG. 5E, in operation S104, all data $\{DO[0], DO[1], DO[2], \ldots, DO[C-1]\}$ of NAND cells having the indices $\{[0], [1], [2], \ldots, [C-1]\}$ from among the odd subpages 62 included in the word-line 605 may be stored in the page buffer 300.

Figure 5F:
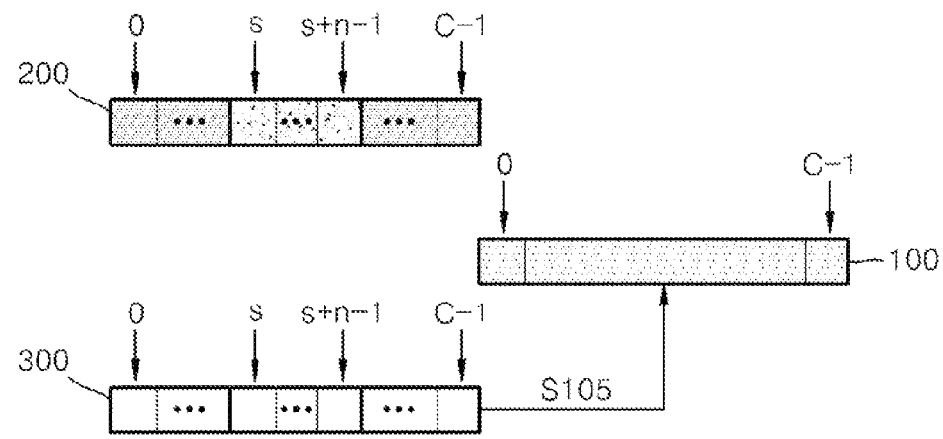
Figure 5F:
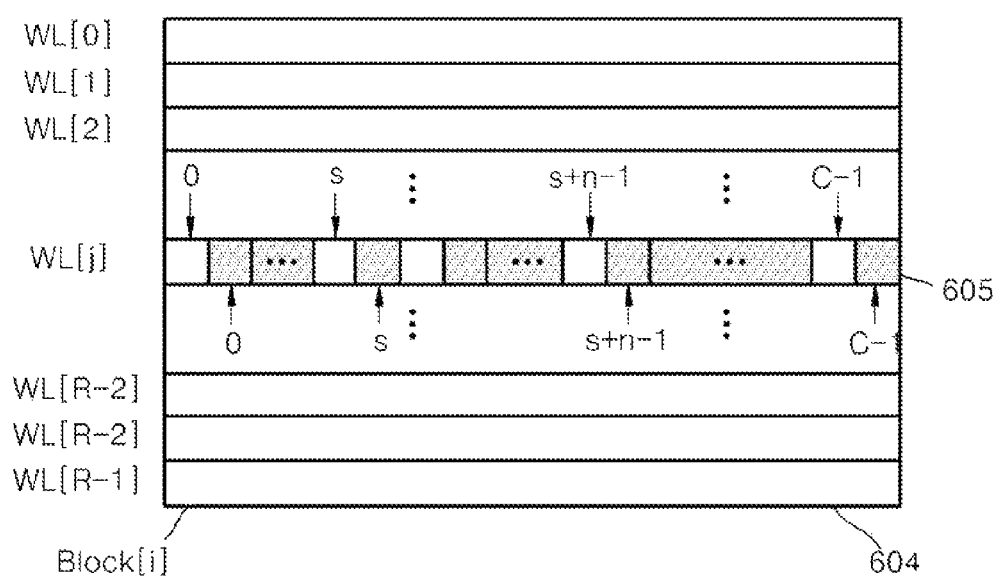

After that, referring to FIG. 5F, in operation S105, the data stored in the page buffer 300 are stored in the odd register 100 so as to correspond to the same indices. As a result, the data $\{DO[0], DO[1], DO[2], \ldots, DO[C-1]\}$ are stored in the odd register 100.

Figure 5G:
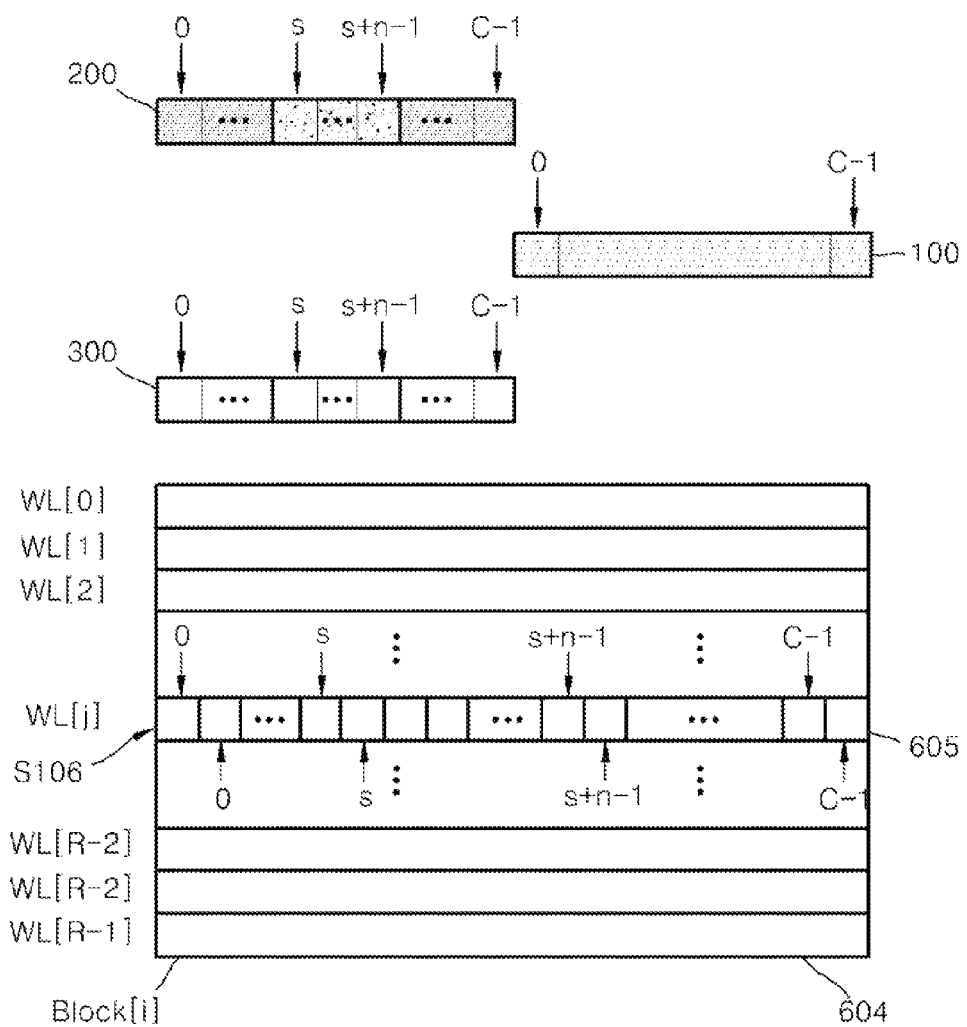

After that, referring to FIG. 5G, in operation S106, all data of the word-line 605 is erased.

Figure 5H:
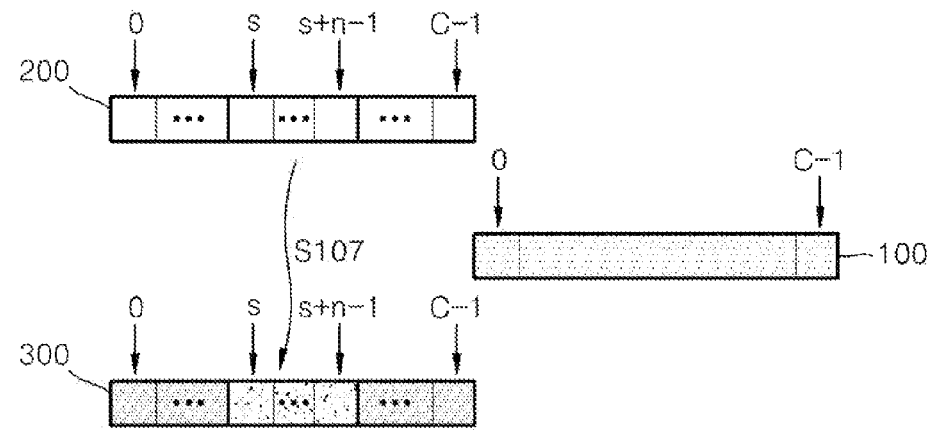
Figure 5H:
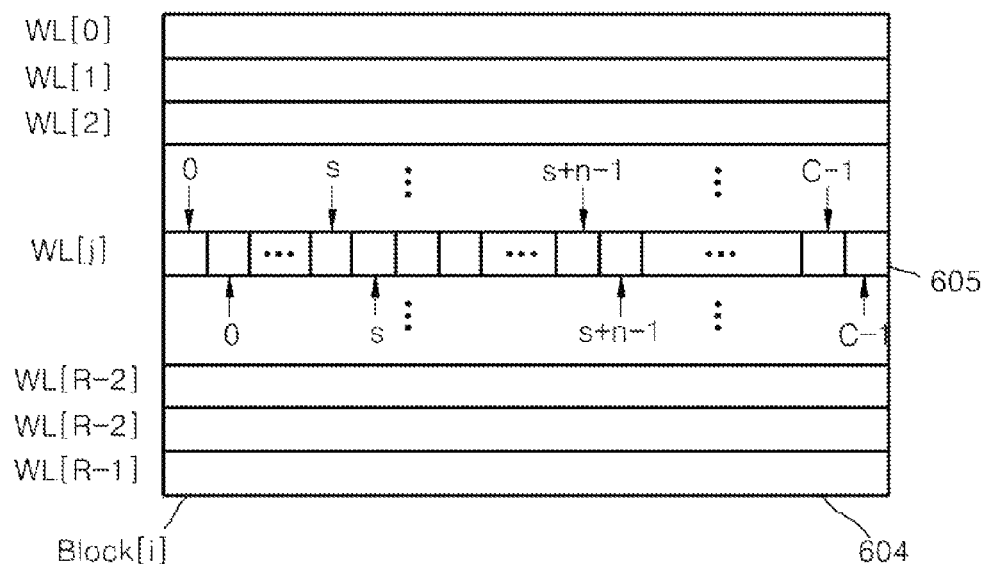

After that, referring to FIG. 5H, in operation S107, the data $\{DE[0], DE[1], \ldots, DE[s-1], DN[s], \ldots, DN[s+n-1], DE[s+n], \ldots, DE[C-1]\}$ stored in the even register 200 are stored in the page buffer 300 so as to correspond to the same indices.

Figure 5I:
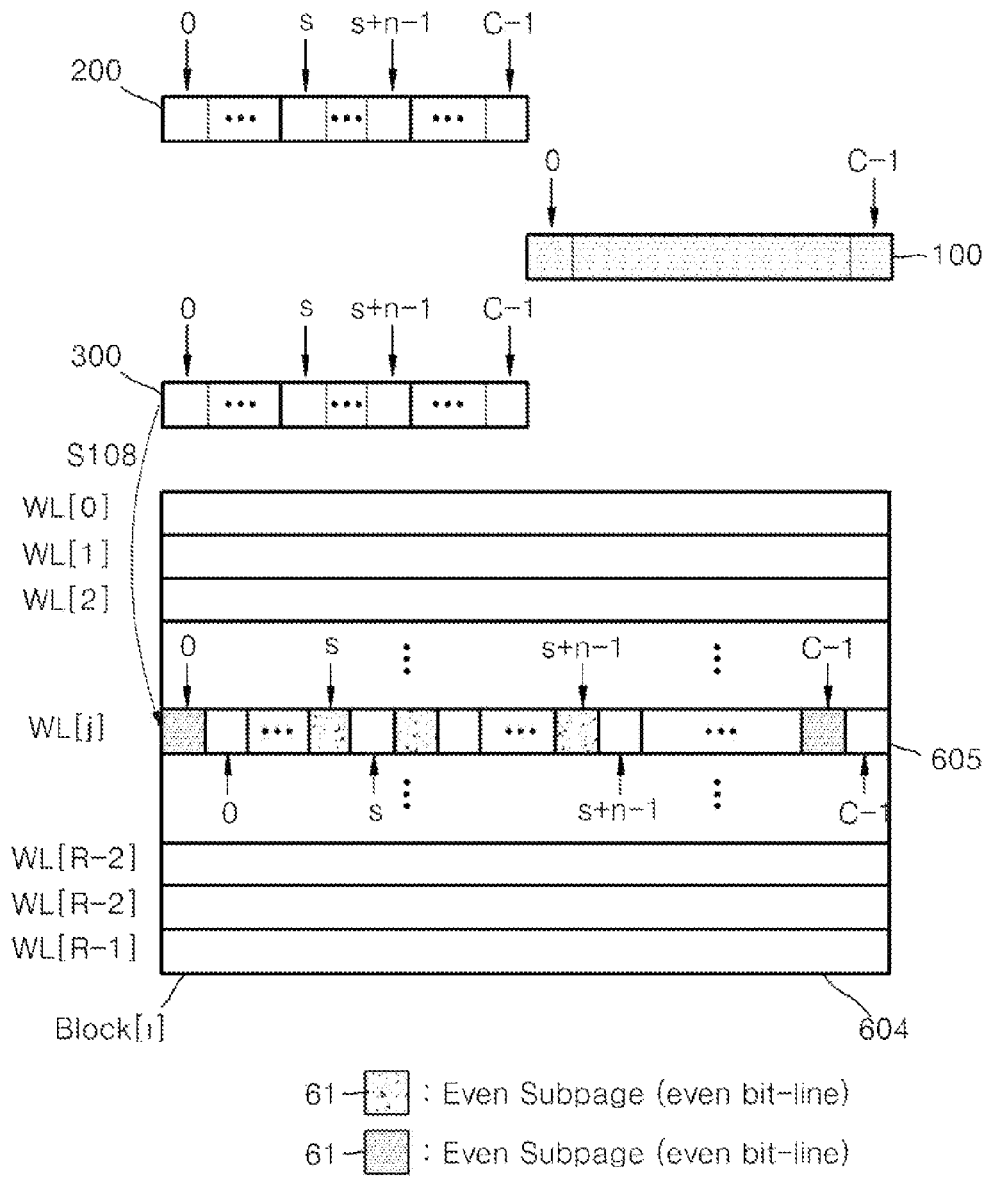

After that, referring to FIG. 5I, in operation S108, the data stored in the page buffer 300 are programmed in the even subpages 61 included in the word-line 605 so as to correspond to the same indices. As a result, the input data $\{DN[s], \ldots, DN[s+n-1]\}$ may be written in the even subpages 61 having the indices $\{[s], \ldots, [s+n-1]\}$, and the original data of FIG. 5A may be constantly maintained in the even subpages 61 having the other indices.

Figure 5J:
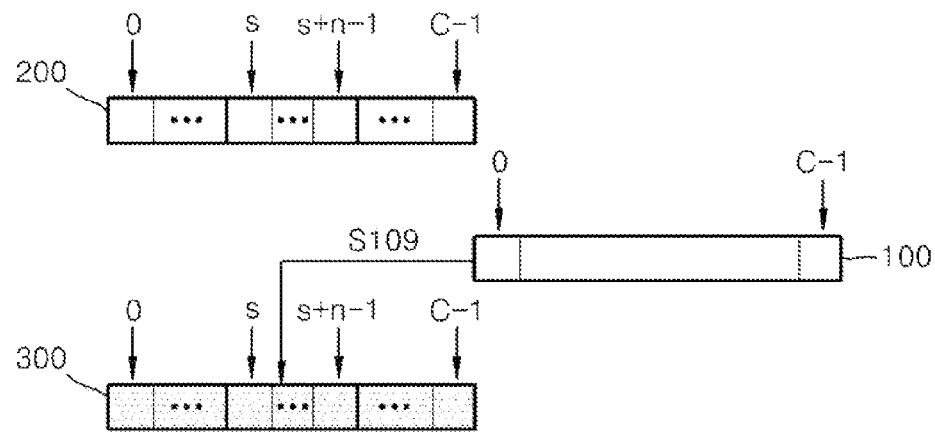
Figure 5J:
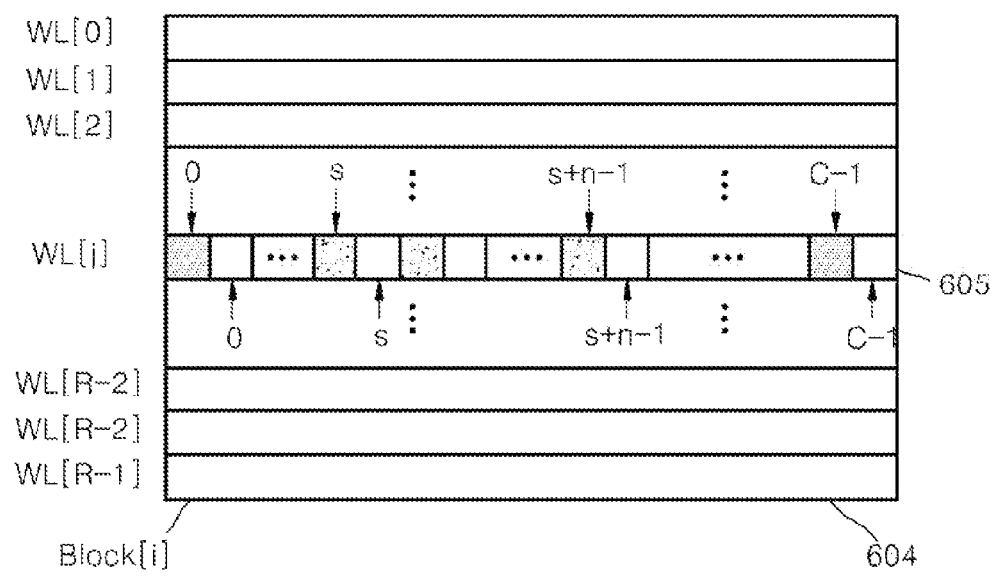

After that, referring to FIG. 5J, in operation S109, the data $\{DO[0], DO[1], DO[2], DO[C-1]\}$ stored in the odd register 100 are stored in the page buffer 300 so as to correspond to the same indices.

After that, referring to FIG. 5K, in operation S110, the data stored in the page buffer 300 are programmed in the odd subpages 62 included in the word-line 605 so as to correspond to the same indices. As a result, the original data of FIG. 5A may be constantly maintained in the odd subpages 62.

By performing a series of operations described above in relation to FIGS. 5A through 5K, data of NAND cells having the indices $\{[s], \ldots, [s+n-1]\}$ from among the even subpages 61 included in the word-line 605 may be replaced by and written as the input data $\{DN[s], \ldots, DN[s+n-1]\}$. For this, a host device may transmit only one instruction.

Similarly to FIG. 3, in FIGS. 5A through 5K, the order of operations S102, S103, S104, and S105 may be changed to an order of operations S104, S105, S102, and S103. Also, the order of operations S107, S108, S109, and S110 may be changed to an order of operations S109, S110, S107, and S108.

FIG. 6 is a schematic diagram showing the internal structure of the memory 1 according to another embodiment of the present invention.

In comparison to the memory 1 illustrated in FIG. 3, the memory 1 illustrated in FIG. 6 may further include an error correction unit 700. Data moved from the page buffer 300 to the even register 200 in operation S103, data moved from the page buffer 300 to the odd register 100 in operation S105, data moved from the even register 200 to the page buffer 300 in operation S107, and data moved from the odd register 100 to the page buffer 300 in operation S109 may be error-corrected by the error correction unit 700.

Also, the memory 1 may further include a control unit 800. The control unit 800 may control the odd register 100, the even register 200, the page buffer 300, and/or the error correction unit 700 to perform operations S101 through S110.

Embodiments of the present invention will now be described with reference to FIGS. 1 through 6.

An embodiment of the present invention relates to a method of writing data, the method including saving input data (Data-in) input from outside the memory 1 including the NAND cell array 400, in the part 201 of the first register 200 included in the memory 1, and saving a part of data stored in the first page 61 of the NAND cell array 400, in the remaining part 202 of the first register 200. In this case, the part of the data stored in the first page 61 may be a remaining part of the first page 61 other than a part in which the input data is to be programmed. This operation may correspond to operations S101, S102, and S103 above.

After that, the method may further include saving data stored in the second page 62 of the NAND cell array 400, in the second register 100 included in the memory 1. This operation may correspond to operations S104 and S105 above.

After that, the method may further include erasing the data stored in the first and second pages 61 and 62. This operation may correspond to operation S106 above.

After that, the method may further include programming the data stored in the first register 200, into the first page 61. This operation may correspond to operations S107 and S108 above.

After that, the method may further include programming the data stored in the second register 100, into the second page 62. This operation may correspond to operations S109 and S110 above.

In the current embodiment, the data moved between the first register 200 and the first page 61 or the data moved between the second register 100 and the second page 62 may pass through the page buffer 300 included in the memory 1.

In the current embodiment, the data moved between the first page 61 and the first register 200 or the data moved between the second page 62 and the second register 100 may be error-corrected.

In the current embodiment, the first and second pages 61 and 62 may be included in one word-line 605 of the NAND cell array 400.

In the current embodiment, the first and second registers 200 and 100 may be static random access memories (SRAMs).

Another embodiment of the present invention relates to the memory 1 including the NAND cell array 400; the control unit 800; and the first and second registers 200 and 100 configured to receive data stored in the NAND cell array 400.

The control unit 800 is configured to store input data provided from outside the memory 1, in the part 201 of the first register 200, store a part of data stored in the first page 61 of the NAND cell array 400, in the remaining part 202 of the first register 200, and store data stored in the second page 62 of the NAND cell array 400, in the second register 100; then erase the data stored in the first and second pages 61 and 62; and then program the data stored in the first register 200, in the first page 61, and program the data stored in the second register 100, in the second page 62.

In the current embodiment, the memory 1 may further include the page buffer 300. Also, the data moved between the first register 200 and the first page 61 or the data moved between the second register 100 and the second page 62 may pass through the page buffer 300.

In the current embodiment, the memory 1 may further include an error correction unit for correcting an error of the data moved between the first page 61 and the first register 200 or the data moved between the second page 62 and the second register 100.

In the current embodiment, the first and second pages 61 and 62 may be included in one word-line 605 of the NAND cell array 400.

Another embodiment of the present invention relates to a method of writing data in the memory 1, wherein the data output device 2 transmits the data, a start address for writing the data, and a writing command signal to the memory 1 including the NAND cell array 400, to complete writing the data in the memory 1 only by the transmitting step.

In this case, the size of the data may be equal to or less than the size of any one of the two or more pages 61 and 62 included in one word-line 605 of the NAND cell array 400. Also, the start address may include a block address, a word-line address, and a bit-line address of the NAND cell array 400.

Another embodiment of the present invention relates to a system for writing data in the memory 1 including the NAND cell array 400, the system including the memory 1; and the data output device 2 configured to write the data in the memory 1. In this case, the memory is configured to complete a process of writing the data in the memory, only by receiving the data and a start address for writing the data.

In this case, the memory 1 may further include the control unit 800; and the first and second registers 200 and 100 configured to receive data stored in the NAND cell array 400. The control unit 800 is configured to store input data provided from outside the memory 1, in the part 201 of the first register 200, store a part of data stored in the first page 61 of the NAND cell array 400, in the remaining part 202 of the first register 200, and store data stored in the second page 62 of the NAND cell array 400, in the second register 100; then erase the data stored in the first and second pages 61 and 62; and then program the data stored in the first register 200, in the first page 61, and program the data stored in the second register 100, in the second page 62.

A memory, and a system for writing data in the memory, according to embodiments of the present invention, may be used as a component of, for example, a computer, a cellular phone, a mobile device, a personal digital assistant (PDA), a navigation device, or a home appliance.

While the present invention has been particularly shown and described with reference to exemplary embodiments thereof, it will be understood by one of ordinary skill in the art that various changes in form and details may be made therein without departing from the spirit and scope of the invention as defined by the following claims.

The exemplary embodiments should be considered in a descriptive sense only and not for purposes of limitation. Therefore, the scope of the invention is defined not by the detailed description of the invention but by the following claims, and all differences within the scope will be construed as being included in the present invention.

The invention claimed is:

1. A method of writing data, the method comprising:
saving input data provided from outside a memory comprising a NAND cell array, in at least a part of a first register comprised in the memory;
after the saving the input data, saving part of data stored in a first page of the NAND cell array, in a remaining part of the first register;
after the saving the part of data, saving data stored in a second page of the NAND cell array, in a second register comprised in the memory;
erasing the data stored in the first page and the second page; and
programming the data stored in the first register, into the first page, and programming the data stored in the second register, into the second page, and programming the data stored in the second register, into the second page,
wherein,
the first register is configured to store 'C' data, and 'C' is the number of bits written in the first page, and the part of the data saved in the remaining part of the first register corresponds to a remaining part of the first page other than a part of the first page in which the input data is to be programmed,
the first page and the second page are comprised in one word-line of the NAND cell array, and
the input data is provided from outside the NAND cell array and a page buffer comprised in the memory.

2. The method of claim 1, wherein the data moved between the first register and the first page or the data moved between the second register and the second page passes through the page buffer comprised in the memory.

3. The method of claim 1, wherein the data moved between the first page and the first register or the data moved between the second page and the second register go through an error-correction process.

4. The method of claim 1, wherein the first register and the second register are of static random access memory (SRAM).

5. A memory comprising:
a NAND cell array;
a control unit; and
a first register and a second register configured to receive data stored in the NAND cell array,
wherein the control unit is configured to:
save input data provided from outside the memory, in at least a part of the first register;
then, store a part of data stored in a first page of the NAND cell array, in a remaining part of the first register,
then, store data stored in a second page of the NAND cell array, in the second register;
then erase the data stored in the first page and the second page; and
then program the data stored in the first register, into the first page, and program the data stored in the second register, into the second page,
wherein,
the first register is configured to store 'C' data, and 'C' is the number of bits written in the first page, and the part of the data saved in the remaining part of the first register corresponds to a remaining part of the first page other than a part of the first page in which the input data is to be programmed,
the first page and the second page are comprised in one word-line of the NAND cell array, and
the input data is provided from outside the NAND cell array and a page buffer comprised in the memory.

6. The memory of claim 5, wherein the data moved between the first register and the first page or the data moved between the second register and the second page passes through the page buffer.

7. The memory of claim 5, further comprising an error correction unit for correcting an error of the data moved between the first page and the first register or the data moved between the second page and the second register.

* * * * *